United States Patent
Feld et al.

(10) Patent No.: US 6,297,637 B1
(45) Date of Patent: Oct. 2, 2001

(54) HIGH-FREQUENCY RECEIVER, PARTICULARLY FOR A NUCLEAR MAGNETIC RESONANCE APPARATUS

(75) Inventors: Peter Feld, Nuremberg; Horst Kroeckel, Bamberg; Markus Vester, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/221,810

(22) Filed: Dec. 29, 1998

(51) Int. Cl.[7] .................................. G01V 3/00
(52) U.S. Cl. ........................................ 324/322
(58) Field of Search .................... 324/322, 309, 324/312, 318, 307

(56) References Cited

U.S. PATENT DOCUMENTS 4,794,337 * 12/1988 Twieg ................. 324/309

5,170,123  12/1992 Holland et al. .............. 324/322

* cited by examiner

Primary Examiner—Hezron Williams
Assistant Examiner—Dixomara Vargas
(74) Attorney, Agent, or Firm—Schiff Hardin & Waite

(57) ABSTRACT

A high-frequency receiver with an analog input part has at least one analog mixer stage, this mixer stage being operable with an injection frequency, and a following digitalization stage. The digitalization stage includes an analog-to-digital converter for digitalizing a signal emitted by the analog input part with a sampling rate prescribed by a sampling frequency. A signal generator for generating the injection frequency or the sampling frequency is connected to the mixer stage and to the analog-to-digital converter, this signal generator generating the injection frequency or the sampling frequency only as a whole number multiple of a basic frequency.

14 Claims, 2 Drawing Sheets

HIGH-FREQUENCY RECEIVER, PARTICULARLY FOR A NUCLEAR MAGNETIC RESONANCE APPARATUS

BACKGROUND OF THE INVENTION

1. Field of the Invention

The present invention is directed to a high-frequency receiver, particularly for a nuclear magnetic resonance apparatus, of the type having an analog input part with at least one analog mixer stage, the mixer stage being operable with an injection frequency, and having a following digitalization stage that includes an analog-to-digital converter for the digitalization of a signal from the analog input part with a sampling rate prescribed by a sampling frequency.

2. Description of the Prior Art

Diagnostics nuclear magnetic resonance apparatuses (magnetic resonance apparatus, MR apparatus) currently employ analog-to-digital converters in the receiver part in order to sample a high-frequency reception signal received from a reception antenna and supply it to an image computer. The dynamics, immunity to interference and bandwidth of the high-frequency receiver critically enter into the quality and flexibility obtainable with the nuclear magnetic resonance apparatus with respect to various applications.

Regardless of whether they are implemented as analog or digital receivers, such receivers are often realized as superheterodyne receivers wherein mixers transform the received nuclear magnetic resonance signal into an intermediate frequency range or into a base frequency range.

U.S. Pat. No. 5,170,123 discloses a high-frequency receiver of this type. The receiver is connected to a high-frequency antenna for the reception of nuclear magnetic resonance signals. The frequency of the reception signals lies on the order of magnitude of 20, 40 or 60 MHZ. After a pre-amplification, the reception signal is supplied to an analog mixer. The mixer converts the reception signal to a fixed intermediate frequency with 125 kHz. This means that the frequency of the local oscillator or the injection frequency for the mixer must differ from the center frequency of the reception signal by this constant intermediate frequency. After low-pass filtering, the reception signal converted to the intermediate frequency is supplied to an analog-to-digital converter that samples the signal with 500 kHz, i.e. a four-fold over-sampling with reference to the intermediate frequency. In particular, frequencies within a frequency band from 0 to 250 kHz can thus be digitalized. The injection frequencies supplied to the mixers and the sampling frequency of the analog-to-digital converter generate harmonics and harmonic combinations that, without anti-interference measures, are superimposed on the reception signal. The necessary anti-interference measures can be considerable.

SUMMARY OF THE INVENTION

An object of the present invention is to provide a high-frequency receiver that is simple to screen with respect to internally generated frequencies.

This object is achieved in a high-frequency receiver of the type initially described having an injection frequency or sampling frequency generator connected to the mixer stage and to the analog-to-digital converter, which generates the injection frequency or sampling frequency only as a whole-number multiple of a basic frequency. All frequencies generated in the analog part of the receiver itself, including their harmonics and their mixed products with one another, are thus whole multiples of this basic frequency. Interference can occur only at reception frequencies that are a multiple of the basic frequency. Anti-interference measures are thus substantially simplified.

The injection frequency and the sampling frequency can be the same or different. Many possibilities for defining the frequency plan of the high-frequency receiver are thus made available.

Anti-interference measures are especially simple in an embodiment wherein the basic frequency and all multiples thereof lie outside the reception signal band. No whole multiples of the basic frequency can fall into an intermediate frequency band. Given arbitrary mixing, all frequency bands that contain an information-carrying signal are free of frequency components generated in the receiver itself.

After an analog-to-digital conversion, the digitalized intermediate frequency is converted into a baseband. Digital multipliers and a digital local oscillator signal whose frequency is determined by the exact center frequency of the payload signal, for example the center frequency of the nuclear magnetic resonance signal, serve this purpose. The digital local oscillator signal is generally not a multiple of the basic frequency. The interference generated in the analog part itself thus also is converted to a frequency outside the baseband.

Following the digital frequency conversion, a reduction to a lower sampling rate is normally undertaken for subsequent signal processing, for example in an image computer. To that end, the baseband signal is conducted over an adjustable, digital interpolation low-pass filter that filters out the noise parts and interference outside the baseband. Since, however, only noise parts and no coherent disturbances are present, relatively slight blocking attenuations around 30 dB suffice for the suppression. Compared thereto, significantly greater values, for example greater than 80 dB, would typically be required for the suppression of coherent disturbances.

In order to keep the outlay for the aforementioned low-pass filter low, the analog-to-digital converter in a further embodiment can be followed by a digital band rejection filter that has a high attenuation at all multiples of the basic frequency, and which eliminates coherent disturbances before the digital frequency conversion. This filter is a type generally referred to as a notch filter. This filter can be constructed simply because of the whole-number relationship between sampling rate and basic frequency. It is advantageous for the sampling rate of the analog-to-digital converter to amount to a relatively small multiple of the basic frequency, for example four.

The digital band elimination filter can be realized as time-discrete system with a finite impulse response (FIR filter—finite impulse response filter) or as a time-discrete system with an infinite impulse response (IIR filter—infinite impulse response filter). The delay elements contained in these filters thereby have a transit time that is equal to the reciprocal of the basic frequency.

High demands as to the flatness (constancy) of the frequency response in broad information signal bands, for example ±0.1 dB given a bandwidth of 500 kHz, cannot always be met with short FIR filters. However, an equalization of the frequency response can then ensue in the following signal processing. For example, a weighting of the spectral components by Fourier analysis is possible in the image computer in nuclear magnetic resonance tomography apparatus. Since coherent disturbances, which are far smaller than the least significant bit (LSB) of the analog-to-digital converter, are also boosted from the noise by the image calculation in the nuclear magnetic resonance apparatus, and since the rounding errors given an IIR filter contain systematic (i.e. coherent) parts, the word width of an IIR filter should be greater than the word width of the analog-to-digital converter.

Even when multiples of the basic frequency fall into the information signal band, the information signal can be equalized when the injection frequency and the sampling frequency are selected as whole multiples of a basic frequency. However, the coherent disturbances can no longer be eliminated by a filter. Since, however, the disturbances are then periodic in the basic frequency and change only insignificantly over the duration of a reception cycle that, for example, has a length up to 100 ms, they can be subtracted from the received signals following the analog-to-digital converter according to a further embodiment. To that end, samples of an estimate of the interference are retained in a memory. The samples are dependent on the selected injection frequencies and must, for example, be reloaded given frequency changes. Since the same rounding errors are always periodically supplied to following stages, a large word width (high bit depth) is required, as in the case of the IIR filter.

In order to compensate slow time changes of the interference, for example due to heating of the components, the estimate of the disturbance can be adaptively conformed to current conditions by averaging the noise parts and interference parts in the time intervals wherein no payload signal is received. By contrast to an IIR filter, however, this adaptation must be switched off during the actual information signal reception. A possible circuit for adaptively conforming the interference is constructed similar to an IIR filter.

DESCRIPTION OF THE PREFERRED EMBODIMENTS

The basic structure and operation of the inventive receiver are explained with reference to the example of a high-frequency receiver for a diagnostic magnetic resonance apparatus. First, the frequency relationships of the high-frequency receiver is described. Given a magnetic basic field strength of 1.5 T, the magnetic resonance apparatus should evaluate magnetic resonance signals of the three chemical elements hydrogen (H), sodium (Na) and phosphorous (P). Via the gyromagnetic constant of the corresponding nucleus, the magnetic basic field strength determines the frequency of the magnetic resonance signal. The received magnetic resonance signal is first converted with a first local oscillator frequency ($1^{st}$ LO freq.) onto a first intermediate frequency dependent on the nucleus to be evaluated. A conversion onto a second intermediate frequency ensues with a fixed, second local oscillator frequency ($2^{nd}$ LO freq.). The following Table 1 reproduces the frequency relationship of the high-frequency receiver.

TABLE 1

| | Frequency Plan | | | | |
|---|---|---|---|---|---|
| Nu-cleus | IR frequency band/ MHZ @ $B_0 = 1.5$ T | $1^{st}$ LO Freq./ MHZ | $1^{st}$ interm. frequency/ MHZ | $2^{nd}$ LO Freq./ MHZ | $2^{nd}$ interm. frequency/MHZ |
| H | 63.2 ... 64 | 350 | 286.8 ... 286 | 285 | 1.8 ... 1.0 |
| Na | 16.725 ... 16.25 | 270 | 286.725 ... 286.25 | 285 | 1.725 ... 1.25 |
| P | 25.65 ... 25.85 | 312.5 | 286.85 ... 286.5 | 285 | 1.85 ... 1.65 |

2.5 MHZ is selected in the analog receiver part—preceding the analog-to-digital conversion—as a basic frequency for all local oscillator frequencies and for the sampling frequency of the analog-to-digital converter. It is assured given this basic frequency that no reception band of the receiver contains a whole multiple of the basic frequency. The following Table 2 shows examples of disturbances which arise at multiples of this basic frequency, these being possibly generated by the local oscillators and the clock for the analog-to-digital conversion.

TABLE 2

| | Examples of Frequencies of the Coherent Disturbances | | |
|---|---|---|---|
| Nu-cleus | LO Harmonic-combination/ MHZ | Harmonic of the sampling frequency/MHZ | Disturbed digital intermediate frequency/MHZ |
| H | $5 \cdot 285 - 4 \cdot 350 = 25$ | $2 \cdot 10 = 20$ | 5 |
| Na | $1 \cdot 350 - 1 \cdot 285 = 65$ | $6 \cdot 10 = 60$ | 5 |
| P | $312.5 - 285 = 27.5$ | $3 \cdot 10 = 30$ | 2.5 |

Figure 1:
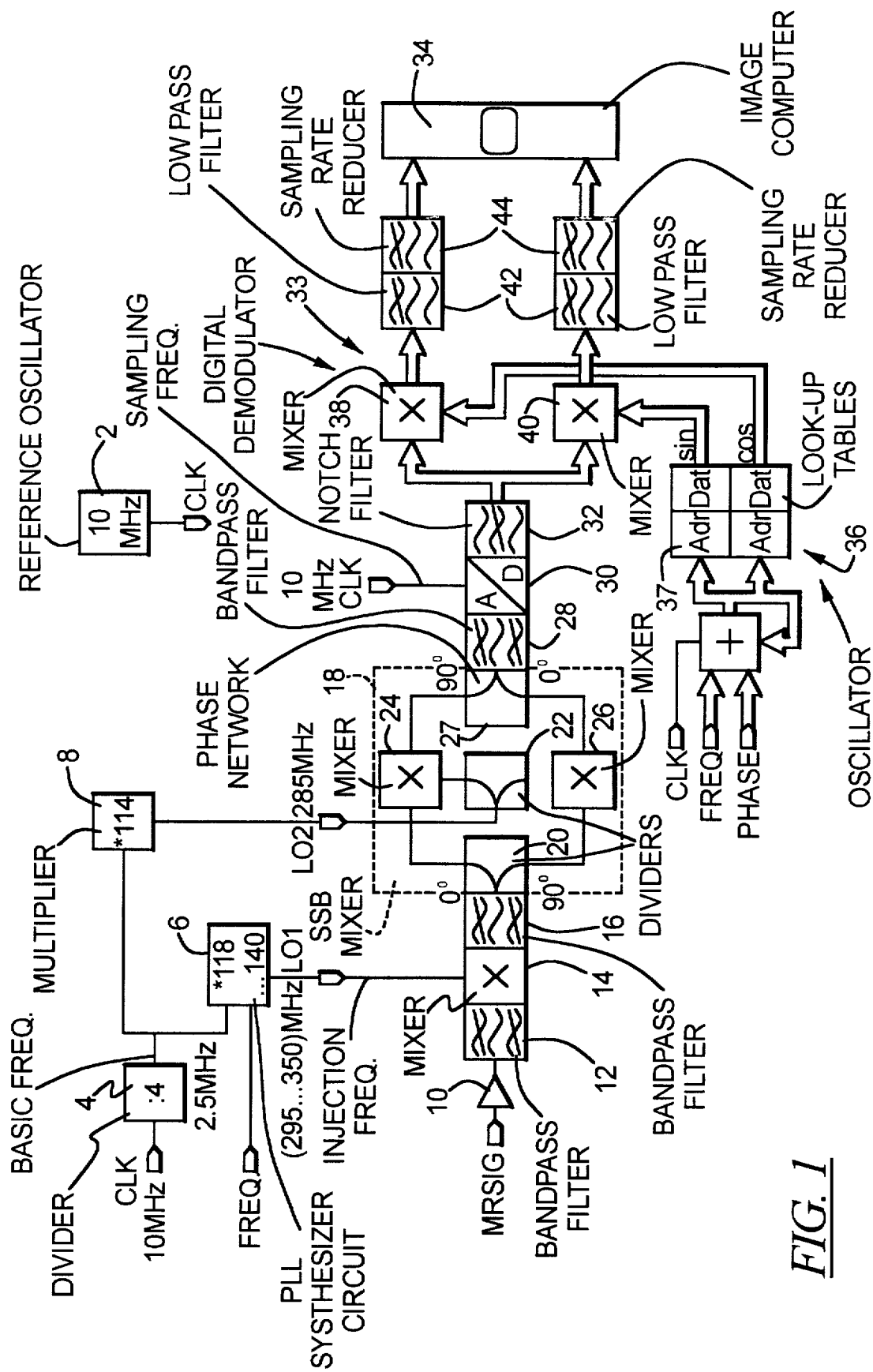
FIG. 1 is a block circuit diagram of a digital superheterodyne receiver constructed in accordance with the invention.

A high-frequency receiver in which the above-recited frequency plan is realized is shown in the block circuit diagram of FIG. 1. The receiver uses a reference oscillator 2 that emits a clock signal CLK of 10 MHZ. This clock signal CLK is divided down to a basic frequency of 2.5 MHZ by a divider 4. A PLL (phase locked loop) synthesizer circuit 6 that multiplies the basic frequency by a variable but whole-number factor is employed as multiplier for generating a first local oscillator frequency or injection frequency LO1. The factor is determined by the magnetic resonance frequency of the nucleus to be examined (H, Na or P here). Dependent on the prescribed frequency FREQ, the multiplication factor lies between 118 and 140 and thus generates first local oscillator frequencies LO1 from 295 to 350 MHZ. Only frequencies that are a whole multiple of the basic frequency of 2.5 MHZ likewise occur within the synthesizer circuit 6.

For generating a second fixed local oscillator frequency LO2, the basic frequency of 2.5 MHZ is boosted to 285 MHZ by a multiplier 8.

A received MR-signal (MRSIG), an analog signal, is amplified with an amplifier 10 to a level suitable for further processing. A bandpass filter 12 following the amplifier 10 reduces the sensitivity of the high-frequency receiver for signals that lie outside the frequency bands of the payload frequency. A following mixer 14, to which the variable local oscillator frequency or injection frequency LO1 is supplied from the multiplier 6, transforms the amplified and filtered MR-signal to a first intermediate frequency band. The mixer is followed by a further bandpass filter 16 in order to suppress frequencies outside the reception bands.

A single-sideband mixer 18 that includes power dividers 20 and 22, mixers 24 and 26 as well as a combiner with phase network 27 serves for the conversion to a second intermediate frequency. The fixed local oscillator frequency LO2 is supplied to the single-sideband mixer 18 as injection frequency for the frequency conversion. The generation of the orthogonal signals required for single-sideband mixing ensues in the power divider 22. A bandpass filter 28 following the single-sideband mixer 18 suppresses noise parts that arise from band regions outside the reception band. Up to these components, the high-frequency receiver is analog.

An analog-to-digital converter 30 that is clocked by the reference oscillator 2 digitalizes the signal at the second intermediate frequency with a clock rate of 10 MHZ. A following notch filter 32 blocks disturbances that lie on multiples of the basic frequency. Although the notch filter 32 is not required based on the inventive principle of operation, it use is still advantageous because the outlay for low-pass filter (yet to be explained) can thus be reduced. Various realizations of the notch filter 32 are also separately described below.

The signal at the second intermediate frequency, which has now been digitalized, is converted with a digital demodulator 33 to the base frequency band into the processing frequency position for an image computer 34. The digital demodulator 33 is likewise clocked with a sampling rate of 10 MHZ and is supplied with a digital local oscillator signal. The local oscillator signal is generated in a numerically controlled oscillator 36 for which a frequency FRQ' and a phase relation PHASE are prescribed in order to generate the injection frequency for the digital demodulator. The oscillator 36 is likewise clocked by the reference oscillator 2. The digital local oscillator signal is ultimately generated as sine and as cosine signal from lookup tables 37. Via the control signals FREQ' and PHASE, the digital local oscillator can be tuned to any desired center frequency in the bands of the second intermediate frequency. The demodulator 33 includes digital mixers 38 and 40 that convert the digitalized reception signal onto the baseband position. Subsequently connected low-pass filters 42 and following sampling rate reducers 44 edit the signal for further-processing in the image computer 34.

The sampling rate reducer 44 is implemented as a low-pass filter that is intended to prevent the aliasing of noise parts and disturbances. A relatively slight blocking attenuation around 30 dB thereby suffices for the suppression of noise parts.

Figure 2:
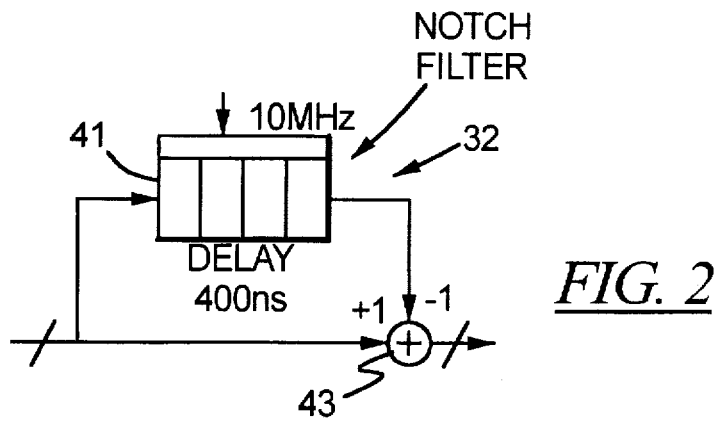
FIG. 2 is a block circuit diagram of the structure of a simple FIR filter for use in the receiver of FIG. 1.
Figure 3:
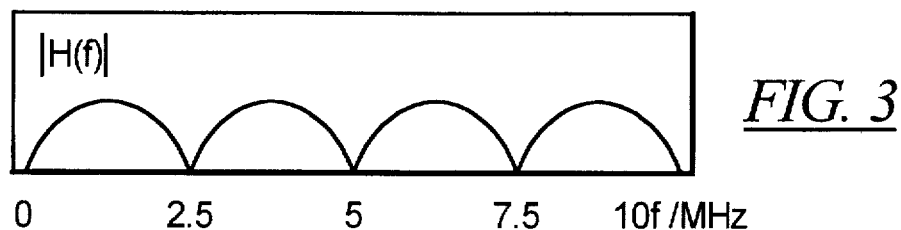
FIG. 3 shows the frequency response of the FIR filter of FIG. 2.

Two possible realizations of the digital notch filter 32 are explained below. A first embodiment of the notch filter 32 is shown in the block circuit diagram of FIG. 2. The filter 32 is implemented as a simple, non-recursive digital filter with a finite impulse response (FIR filter) with zeroizing at all multiples of the basic frequency of 2.5 MHZ. It is composed of a delay 41 clocked with 10 MHZ and a subtractor 43. The delay value corresponds to the reciprocal of the basic frequency and amounts to 400 ns. Four stages are required for this purpose given a clock of 10 MHZ. FIG. 3 shows the magnitude of the frequency response |H(f)| of this filter.

Figure 4:
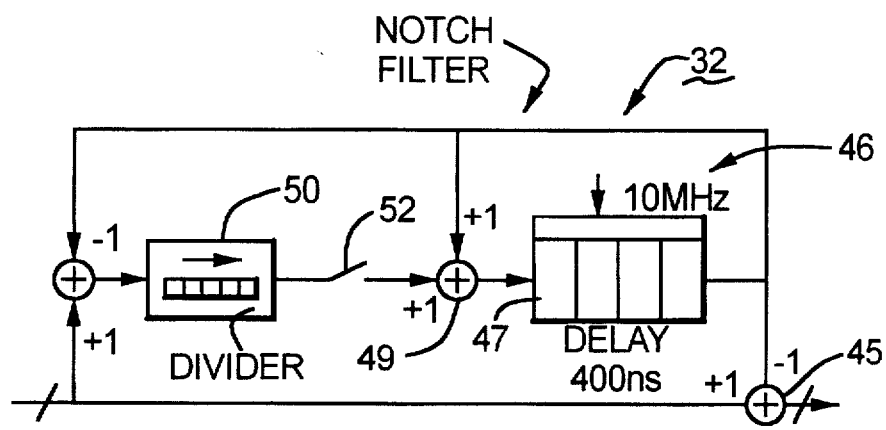
FIG. 4 is a block circuit diagram of an IIR filter and with a connectable adaptive adaptation of an approximative value of the disturbance for use in the receiver of FIG. 1

FIG. 4 shows a recursive digital filter (IIR filter) as a realization of the notch filter 32. This filter has a memory loop 46 for the coherent noise signal and a coupling circuit to the digital data path. An approximation value or an estimate of the noise signal is stored in the memory loop 46, this being subtracted from the information signal in a subtractor 45. The memory loop 46 is composed of a shift register 47 whose length corresponds to the reciprocal of the frequency of the coherent disturbance. Given clocking with 10 MHZ, a delay of 400 ns with four clocks arises. A sample of the noise signal proceeds through the shift register 47 exactly once during a period of the basic frequency. The values of the noise signal that appear at the output of the shift register 47 are re-supplied to the input of the shift register 47 via an adder 49.

However, the input of the shift register 48 is not supplied with the entire signal which is present at its output. Instead, a part c acquired by a divider 50—whereby c is a factor between zero and 1—is subtracted from the circulating noise signal and is replaced by a corresponding part of the input signal. In this way, the approximation value or the estimate of the noise signal is gradually adapted to the coherent noise components actually contained in the input signal. The information and noise signal parts not correlated with the rotation time average out. One thus obtains an IIR filter with exponentially decaying impulse response. The time constant is derived from the reciprocal of the basic frequency multiplied by the factor c (corresponds to the part of the replaced noise signal), whereby the factor c is greater than zero and less than 1. This corresponds to the reciprocal of the notch bandwidth BG of the notch filter 32. The notch bandwidth can be selected small in order to also be able to transmit information signals lying very close to the multiples of the basic frequency with a negligible influence on the information frequency response. The divider circuit 50 can be constructed of a bit shift circuit that shifts the samples toward the right by a whole number of places. Since coherent disturbances that are far smaller than the least significant bit of the analog-to-digital converter 30 can be boosted from the noise by the image calculation, the word width of the filter 32 should be greater than the word width of the analog-to-digital converter 30.

A switch 52 in the adaption circuit is normally closed. It can be opened when the receiver—outside the reception times—is in other operating conditions with different coherent noise parts for other purposes (for example, for monitoring a transmitter signal). During this time, the factor c=0 then applies; the adaptation is interrupted. On the other hand, the entire feedback part disappears given the selection of c=1 and the filter converts into the simple FIR filter that has already been described.

Figure 5:
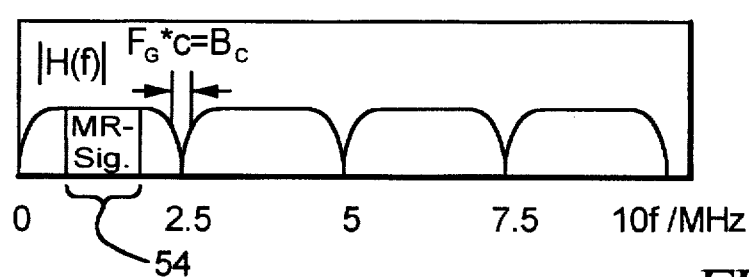
FIG. 5 shows the frequency response of the IIR filter of FIG. 4.

FIG. 5 shows the magnitude of the frequency response |H(f)| of the filter of FIG. 4. The filter has zeroizing, i.e. an extremely high blocking attenuation, at zero, the basic frequency and multiples thereof. The edge steepness for the zeroizing is defined by the factor c and can be greater than given the FIR filter that was already described above. The information frequency band lies between the notches in the frequency response and is referenced 54.

Even when the basic frequency is selected such that multiples thereof fall into an information frequency band, the outlay for equalization can be considerably diminished with the condition that the injection frequencies and the sampling rate are multiples of a basic frequency. The structure of the receiver explained on the basis of FIG. 1 is thereby retained. However, the frequency plan is correspondingly differently determined. Disturbances generated in the analog reception part are, however, coherent because they are all multiples of a single frequency, the basic frequency. An anti-interference principle can then be applied wherein an estimate of the disturbance is subtracted from the disturbed information signal. The subtraction can ensue directly after the analog-to-digital conversion with a circuit that is constructed like the IIR filter of FIG. 4. This circuit replaces the notch filter 32 in FIG. 1. A precondition is that the disturbance remains unvaried during the reception. An estimate or an approximated value of the disturbance is stored in the shift register 48. For example, this can occur before the reception by closing the switch 52. A representation of the disturbance is built up over a number of cycles in the memory 48 from the coherent disturbance generated in the receiver. The switch 52 is then opened during the reception.

Although modifications and changes may be suggested by those skilled in the art, it is the intention of the inventors to embody within the patent warranted hereon all changes and modifications as reasonably and properly come within the scope of their contribution to the art.

We claim as our invention:

1. A high-frequency receiver comprising:

an analog circuit supplied with an analog input signal and emitting an analog output signal;

a mixer in said analog circuit acting on said analog input signal and operable with an injection frequency to produce said analog output signal;

a digital circuit having a digital circuit input supplied with said analog output signal and containing an analog-to-digital converter for digitizing said analog output signal at a sampling rate prescribed by a sampling frequency; and a signal generator which generates a signal at said injection frequency, supplied to said mixer, and a signal at said sampling frequency, supplied to said analog-to-digital converter, only as a whole-number multiple of a basic frequency.

2. A high-frequency receiver as claimed in claim 1 wherein said sampling frequency is different from said injection frequency.

3. A high-frequency receiver as claimed in claim 1 wherein said high-frequency receiver has a reception signal band, and wherein said basic frequencies and all multiples thereof are outside of said reception signal band.

4. A high-frequency receiver as claimed in claim 1 wherein said digital circuit comprises a digital frequency converter following said analog-to-digital converter, said digital frequency converter operating at a digital frequency converter injection frequency which is not a whole-number multiple of said basic frequency, and a further signal generator, connected to said digital frequency converter, for generating a signal at said digital frequency converter injection frequency.

5. A high-frequency receiver as claimed in claim 1 wherein said digital circuit further comprises a digital band elimination filter, following said analog-to-digital converter, for suppressing whole-number multiples of said basic frequency.

6. A high-frequency receiver as claimed in claim 5 wherein said digital circuit comprises a digital frequency converter following said analog-to-digital converter, said digital frequency converter operating at a digital frequency converter injection frequency which is not a whole-number multiple of said basic frequency, and a further signal generator, connected to said digital frequency converter, for generating a signal at said digital frequency converter injection frequency, said digital band elimination filter being connected in front of said digital frequency converter.

7. A high-frequency receiver as claimed in claim 5 wherein said digital band elimination filter comprises a time-discreet system with a finite impulse response.

8. A high-frequency receiver as claimed in claim 7 wherein said digital band elimination filter comprises a digital delay path, said delay path having a transit time which is equal to a reciprocal of said basic frequency, and a subtractor connected in parallel with said delay path.

9. A high-frequency receiver as claimed in claim 5 wherein said digital band elimination filter comprises a time-discreet system having an infinite impulse response.

10. A high-frequency receiver as claimed in claim 9 wherein said digital band elimination filter comprises a feedback delay line with a cycle time equal to a reciprocal of said base frequency, said delay line storing an approximation value of a disturbance generated by said basic frequency and multiples thereof, a first subtractor connected to an output of said analog-to-digital converter and to said feedback delay line, a second subtractor connected to a divider for replacing a part of said approximation value with a part of an input signal to said band elimination filter for adapting said approximation value to a currently-existing disturbance.

11. A high-frequency receiver as claimed in claim 9 further comprising a switch connected in said digital band elimination filter for temporarily interrupting adaptation of said approximation value to said currently existing disturbance.

12. A high-frequency receiver as claimed in claim 1 having a reception signal band, and wherein at least one multiple of said basic frequency is within said reception signal band, and further comprising:

a subtractor connected following said digital stage; and a memory connected to said subtractor, said memory storing an approximation value of a disturbance caused by multiples of said basic frequency, and said subtractor subtracting said approximation value stored in said memory from an output of said digital stage.

13. A high-frequency receiver as claimed in claim 11 further comprising means connected to said memory for loading said approximation value into said memory.

14. A high-frequency receiver as claimed in claim 11 further comprising means connected to said memory for gradually matching said approximation value of said disturbance activatable in a time span outside of a reception time of said high-frequency receiver.

* * * * *